(12) United States Patent
Han et al.

(10) Patent No.: US 12,058,914 B2
(45) Date of Patent: Aug. 6, 2024

(54) DISPLAY DEVICE

(71) Applicant: LG Display Co., Ltd., Seoul (KR)

(72) Inventors: Bumhee Han, Gwangju (KR); JiWon Kim, Seoul (KR); Sunggon Hong, Gimpo-si (KR); MinSeob Song, Jeonju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/989,312

(22) Filed: Nov. 17, 2022

(65) Prior Publication Data
US 2023/0217778 A1 Jul. 6, 2023

(30) Foreign Application Priority Data

Dec. 31, 2021 (KR) .......................... 10-2021-0194265

(51) Int. Cl.
*H10K 59/40* (2023.01)
*G06F 3/041* (2006.01)
*G06F 3/044* (2006.01)
*H10K 59/131* (2023.01)

(52) U.S. Cl.
CPC .......... *H10K 59/40* (2023.02); *G06F 3/04164* (2019.05); *G06F 3/04182* (2019.05); *G06F 3/0446* (2019.05); *H10K 59/1315* (2023.02); *G06F 2203/04111* (2013.01)

(58) Field of Classification Search
CPC ...... G06F 3/041–047; G06F 2203/041–04114; G06F 3/04164; H10K 59/00–95; H10K 59/40; H10K 50/82; H10K 59/126; H10K 59/8052; H10K 59/805; H10K 50/816; G09G 2300/0426
See application file for complete search history.

(56) References Cited

U.S. PATENT DOCUMENTS

2020/0212132 A1* 7/2020 Kim .......................... G09G 3/32

FOREIGN PATENT DOCUMENTS

| CN | 113725263 A | * | 11/2021 | ........... G06F 3/0412 |
| CN | 113748513 A | * | 12/2021 | ........... H01L 27/322 |
| EP | 3624197 A1 | * | 3/2020 | ........... G06F 3/0412 |
| KR | 10-2020-0082364 A | | 7/2020 | |

(Continued)

OTHER PUBLICATIONS

CN-113725263-A (Year: 2020).*
KR-20220117372-A (Year: 2021).*

*Primary Examiner* — Sanjiv D. Patel
(74) *Attorney, Agent, or Firm* — Fenwick & West LLP

(57) ABSTRACT

A display device includes light emitting elements in an active area and each light emitting element includes an anode, a light emitting layer, and a cathode; signal lines in a non-active area outside the active area; an encapsulation unit on the light emitting elements and the signal lines; touch electrodes on the encapsulation unit in the active area; first lines on the encapsulation unit in the non-active area and electrically connected to the touch electrodes; a second line outside the first lines; first auxiliary lines under the first lines and respectively electrically connected to a part of the first lines through first electrodes; and a second auxiliary line under the second line and electrically connected to the second line through a second electrode. The cathode is on an entire surface of the active area and extends to a shielding area of the non-active area.

15 Claims, 10 Drawing Sheets

(56) References Cited

FOREIGN PATENT DOCUMENTS

| KR | 20220117372 A | * | 2/2021 |
| KR | 10-2021-0034203 A | | 3/2021 |
| KR | 20220117372 A | * | 8/2022 |

* cited by examiner

DISPLAY DEVICE

CROSS-REFERENCE TO RELATED APPLICATION

This application claims the benefit of and priority to Republic of Korea Patent Application No. 10-2021-0194265 filed on Dec. 31, 2021, in the Republic of Korea, which is hereby incorporated by reference in its entirety.

BACKGROUND

Technical Field

The present disclosure relates to a display device.

Discussion of the Related Art

In accordance with the advance of the information society, demand for a display device displaying an image is increasing, and various types of display devices such as a liquid crystal display device and an organic light emitting display device are being used.

In order to provide different functions to a user, such a display device provides a function of recognizing a user's touch on a display panel and performing input processing based on the recognized touch.

For example, a display device capable of touch recognition includes a plurality of touch electrodes disposed or built in a display panel, and by driving the touch electrodes, presence or absence of a user's touch on the display panel, touch coordinates and the like may be detected.

In recent years, since demand for high performance of a touch function of the display panel is further increased, a design for increasing efficiency of a touch electrode itself is being adopted.

In addition, a size of the display device is a very important factor in design, for example, since demand for a high ratio of a size of an active area to a size of a non-active area, which is referred to as a screen-to-bezel ratio, is further increased, various attempts are being made to implement a narrow bezel.

As various components for driving a display panel and a touch panel are disposed in a non-active area of a display device, and demand for a narrow bezel further increases, there is a limitation in that the display device is not robust to electrical noise.

SUMMARY

A display device according to an embodiment of the present disclosure provides a structure robust to electrical noise that may be received by touch signal lines in a non-active area of a display panel.

According to an aspect of the present disclosure, a display device includes a plurality of light emitting elements in an active area and including an anode, a light emitting layer, and a cathode; a plurality of signal lines in a non-active area outside the active area; an encapsulation unit on the plurality of light emitting elements and the plurality of signal lines; a plurality of touch electrodes on the encapsulation unit in the active area; a plurality of first lines on the encapsulation unit in the non-active area and electrically connected to the plurality of touch electrodes; a second line outside the plurality of first lines; a plurality of first auxiliary lines under the plurality of first lines and respectively electrically connected to a part of the plurality of first lines through a plurality of first electrodes; and a second auxiliary line under the second line and electrically connected to the second line through a second electrode. The cathode is disposed on an entire surface of the active area and extends to a shielding area of the non-active area.

According to another aspect of the present disclosure, a display device includes a cathode disposed from an active area to a shielding area of a non-active area; a plurality of signal lines in the non-active area; a plurality of touch routing lines in the shielding area; and a ground line at an outer periphery of the non-active area and connected to a lower line through a second connection electrode. A part of the plurality of touch routing lines is respectively connected to a plurality of bridge lines through a plurality of first connection electrodes. The lower line extends to the shielding area.

According to the embodiment of the present disclosure, since the auxiliary line extending to the touch routing line is configured, it is possible to block electrical noise that may be received by the touch signal lines in the non-active area of the display panel from a driving signal line in the non-active area. Accordingly, it is possible to provide a display device that is robust to electrical noise.

According to the embodiment of the present disclosure, since a structure for blocking electrical noise is disposed in the non-active area of the display panel without additional components, it is possible to provide a display device capable of having an advantage of implementing a narrow bezel, and providing a degree of freedom in designing a shape of the non-active area.

DETAILED DESCRIPTION

Figure 1:
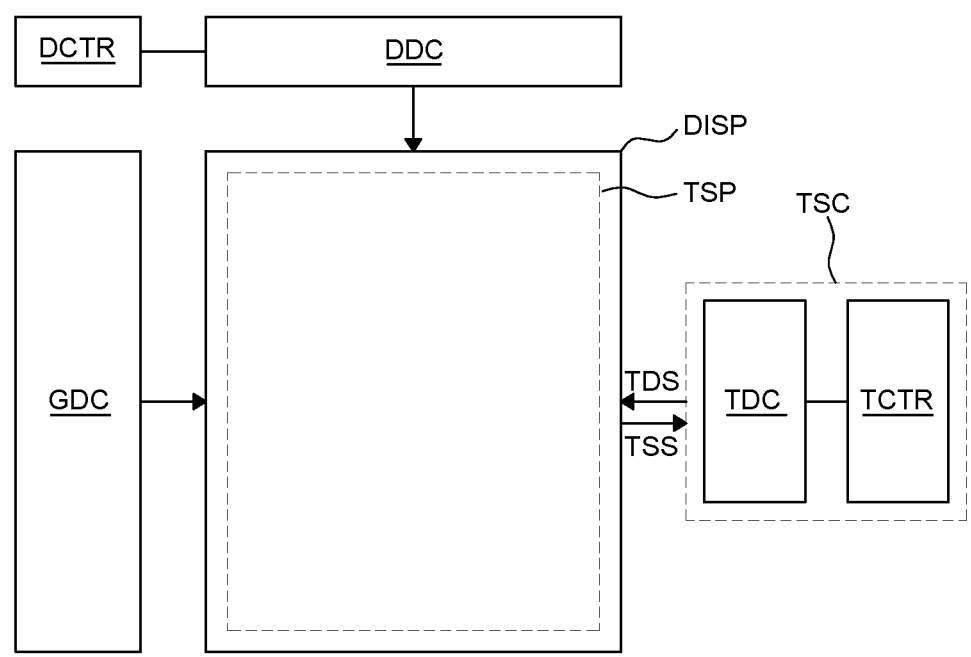
FIG. 1 illustrates a display device according to an embodiment of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When the relation of a time sequential order is described using the terms such as "after", "continuously to", "next to", and "before", the order may not be continuous unless the terms are used with the term "immediately" or "directly".

Although the terms "first", "second", and the like are used for describing various components, these components are not confined by these terms. These terms are merely used for distinguishing one component from the other components. Therefore, a first component to be mentioned below may be a second component in a technical concept of the present disclosure.

The features of various embodiments of the present disclosure can be partially or entirely adhered to or combined with each other and can be interlocked and operated in technically various ways, and the embodiments can be carried out independently of or in association with each other.

In the present disclosure, "display devices" may include narrow-sense display devices, such as a liquid crystal module (LCM), an organic light emitting module (an OLED module), and a quantum dot module (a QD module) that include a display panel and a driving unit for driving the display panel. Also, the display devices may include a set device (or a set apparatus) or a set electronic apparatus such as a notebook computer, a TV, a computer monitor, an equipment display apparatus including an automotive display apparatus or another type of apparatus for vehicles, or a mobile electronic device such as a smartphone or an electronic pad, which is a complete product (or a final product) including an LCM, an OLED module, or a QD module.

Therefore, the display devices of the present disclosure may include a narrow-sense display device itself, such as an LCM, an OLED module or a QD module, and a set device which is a final consumer device or an application product including an LCM, an OLED module, or a QD module.

In addition, in some cases, an LCM, an OLED module and a QD module including a display panel and a driving unit may be referred to as narrow-sense "display devices", and electronic devices as complete products including an LCM, an OLED module, and a QD module may be referred to as "set devices". For example, the narrow-sense display device may include an LCD, OLED or QD display panel and a source printed circuit board (PCB) which is a controller for driving the display panel. The set device may further include a set PCB which is a set controller electrically connected to the source PCB to control the set device overall.

As a display panel used in the present embodiment, all types of display panels such as liquid crystal display panels, organic light emitting diode (OLED) display panels, quantum dot (QD) display panels, electroluminescent display panels, and the like may be used. Furthermore, the display panel used in the present embodiment is not limited to a specific display panel capable of bezel bending with a flexible substrate for the OLED display panel and a lower back plate support structure of the present embodiment. In addition, it is not limited to a shape or size of the display panel used in the display device according to the embodiment of the present disclosure.

For example, when the display panel is an OLED display panel, the display panel may include a plurality of gate lines and data lines, and pixels formed at intersections of the gate lines and the data lines. In addition, the display panel may be configured to include an array including a thin film transistor, which is an element for selectively applying a voltage to each pixel, an organic light emitting diode (OLED) layer on the array, and an encapsulation substrate or an encapsulation layer disposed on the array to cover the organic light emitting diode layer and the like. The encapsulation layer may protect the thin film transistor and the organic light emitting diode layer and the like from external impacts and prevent penetration of moisture or oxygen into the organic light emitting diode layer. In addition, the layer formed on the array may include an inorganic light emitting layer, for example, a nano-sized material layer or quantum dots.

Hereinafter, various configurations of a display device capable of implementing a narrow bezel, which is reliable and robust to electrical deformation by blocking electrical noise that may be received by touch signal lines in a non-active area of the display panel from driving signal lines in the non-active area since an auxiliary line extending to a touch routing line is configured, will be described in detail.

FIG. 1 illustrates a display device according to an embodiment of the present disclosure.

With reference to FIG. 1, the display device according to an embodiment of the present disclosure may provide both an image display function and a touch sensing function.

In order to provide the image display function, the display device according to an embodiment of the present disclosure may include a display panel DISP in which a plurality of data lines and a plurality of gate lines are disposed and a plurality of sub-pixels defined by the plurality of data lines and the plurality of gate lines are disposed, a data driving circuit DDC for driving the plurality of data lines, a gate driving circuit GDC for driving the plurality of gate lines, a display controller DCTR for controlling operations of the data driving circuit DDC and the gate driving circuit GDC, and the like.

Each of the data driving circuit DDC, the gate driving circuit GDC and the display controller DCTR may be implemented as at least one individual component. In some cases, two or more of the data driving circuit DDC, the gate driving circuit GDC and the display controller DCTR may be integrated into one component. For example, the data driving circuit DDC and the display controller DCTR may be implemented as a single integrated circuit chip (IC Chip).

In order to provide the touch sensing function, the display device according to the embodiment of the present disclosure may include a touch panel TSP including a plurality of touch electrodes, and a touch sensing circuit TSC for supplying a touch driving signal TDS to the touch panel TSP, detecting a touch sensing signal from the touch panel TSP, and sensing presence or absence of a user's touch or a touch position (touch coordinates) on the touch panel TSP based on the detected sensing signal.

The touch sensing circuit TSC may include a touch driving circuit TDC for supplying the touch driving signal TDS to the touch panel TSP and detecting the touch sensing signal from the touch panel TSP, and a touch controller TCTR for sensing presence or absence of a user's touch and/or a touch position on the touch panel TSP based on the touch sensing signal detected by the touch driving circuit TDC.

The touch driving circuit TDC may include a first circuit part for supplying the touch driving signal TDS to the touch panel TSP and a second circuit part for detecting the touch sensing signal from the touch panel TSP.

The touch driving circuit TDC and the touch controller TCTR may be implemented as individual components or in some cases, may be integrated into a single component.

Each of the data driving circuit DDC, the gate driving circuit GDC and the touch driving circuit TDC may be implemented as at least one integrated circuit. In view of electrical connection with the display panel DISP, each of the data driving circuit DDC, the gate driving circuit GDC and the touch driving circuit TDC may be implemented as a COG (chip on glass) type, a COF (chip on film) type, a TCP (tape carrier package) type or the like, and the gate driving circuit GDC may be implemented as a GIP (gate in panel) type.

Each of circuit configurations (DDC, GDC, and DCTR) for display driving and circuit configurations (TDC and TCTR) for touch sensing may be implemented as at least one individual component. In some cases, at least one of the circuit configurations (DDC, GDC, and DCTR) for display driving and the circuit configurations (TDC and TCTR) for touch sensing may be functionally integrated and implemented as at least one component.

For example, the data driving circuit DDC and the touch driving circuit TDC may be integrated into one or two or more integrated circuit chips. When the data driving circuit DDC and the touch driving circuit TDC are integrated into two or more integrated circuit chips, each of the two or more integrated circuit chips may have a data driving function and a touch driving function.

The display device according to the embodiment of the present disclosure may be an organic light emitting display device, a liquid crystal display device, and the like. For example, the display panel DISP may be of various types such as an organic light emitting display panel, a liquid crystal display panel and the like, but hereinafter, the display panel DISP will be described as an organic light emitting display panel as an example.

As will be described later, the touch panel TSP may include a plurality of touch electrodes to which the touch driving signal TDS may be applied or in which a touch sensing signal may be detected, and a plurality of touch routing lines for connecting the plurality of touch electrodes to the touch driving circuit TDC.

The touch panel TSP may be disposed outside the display panel DISP. For example, the touch panel TSP and the display panel DISP may be separately manufactured and combined or connected to each other. Such a touch panel TSP may be referred to as an external type or an add-on type, but is not limited thereto.

As another example, the touch panel TSP may be built in the display panel DISP. For example, when manufacturing the display panel DISP, a touch sensor structure such as the plurality of touch electrodes and the plurality of touch routing lines constituting the touch panel TSP may be formed together with electrodes and signal lines for display driving. The touch panel TSP may be referred to as a built-in type, but is not limited thereto. Hereinafter, a case in which the touch panel TSP is a built-in type will be described as an example.

Figure 2:
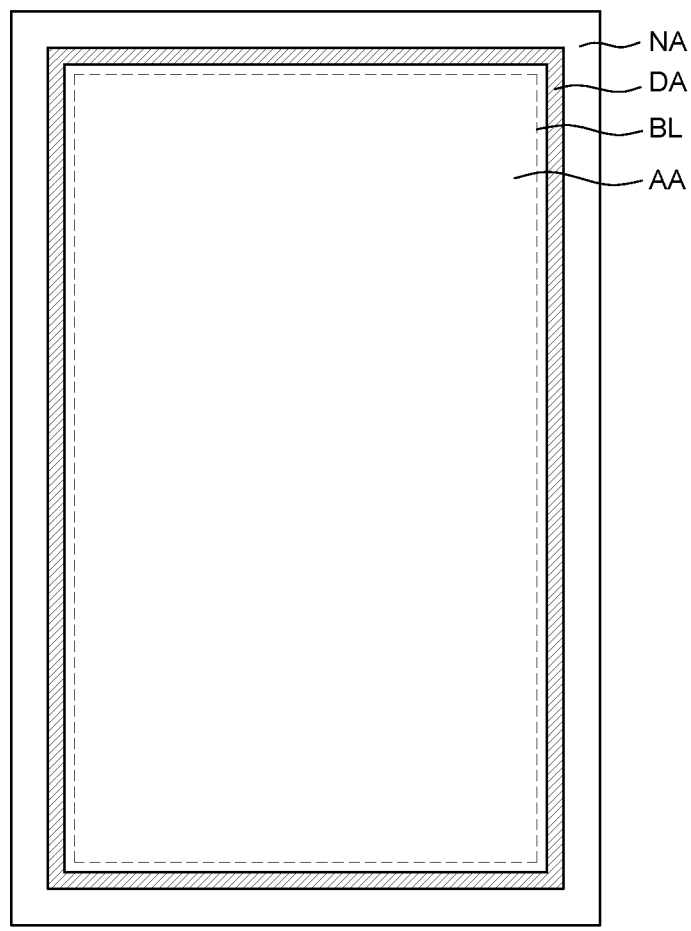
FIG. 2 illustrates a display panel of the display device according to an embodiment of the present disclosure.

FIG. 2 illustrates a display panel of the display device according to an embodiment of the present disclosure.

With reference to FIG. 2, the display panel DISP may include an active area (or a display area) AA in which an image is displayed, and a non-active area (or a non-display area) NA that is an outer area of an outer boundary line BL of the active area AA. The active area AA may be a display area or a screen unit, and the non-active area NA may be a non-display area or a bezel area, and they are not limited thereto.

In the active area AA of the display panel DISP, the plurality of sub-pixels for displaying an image are disposed, and various electrodes or signal lines for display driving are disposed.

In the active area AA of the display panel DISP, the plurality of touch electrodes for touch sensing and the plurality of touch routing lines electrically connected to the touch electrodes may be disposed. Accordingly, the active area AA may be referred to as a touch sensing area capable of touch sensing.

In the non-active area NA of the display panel DISP, link lines extending from various signal lines disposed in the active area AA or link lines electrically connected to various signal lines disposed in the active area AA, and pads electrically connected to the link lines may be disposed. The pads disposed in the non-active area NA may be bonded or electrically connected to the display driving circuits (DDC, GDC, and the like).

In the non-active area NA of the display panel DISP, link lines extending from the plurality of touch routing lines disposed in the active area AA or link lines electrically connected to the plurality of touch routing lines disposed in the active area AA, and pads electrically connected to the link lines may be disposed. The pads disposed in the non-active area NA may be bonded or electrically connected to the touch driving circuit TDC.

In the non-active area NA, there may be provided a portion to which a portion of an outermost touch electrode among the plurality of touch electrodes disposed in the active area AA is extended. In addition, at least one electrode (a touch electrode) of the same material as the plurality of touch electrodes disposed in the active area AA may be further disposed in the non-active area NA.

For example, all of the plurality of touch electrodes disposed on the display panel DISP exist in the active area AA, or a part of the plurality of touch electrodes disposed on the display panel DISP (e.g., the outermost touch electrode) may be disposed in the non-active area NA, or a part of the plurality of touch electrodes disposed on the display panel DISP (e.g., the outermost touch electrode) may be disposed over the active area AA and the non-active area NA.

With reference to FIG. 2, the display panel DISP of the display device according to the embodiment of the present disclosure may include a dam area DA in which a dam for preventing any layer (for example, an encapsulation unit in the organic light emitting display panel) in the active area AA from collapsing is disposed.

The dam area DA may be located at a boundary point between the active area AA and the non-active area NA or at any point of the non-active area NA which is an outer area of the active area AA.

The dam disposed in the dam area DA may be disposed to surround all directions of the active area AA or may be disposed only on an outer periphery of one or two or more portions (for example, a portion with a layer that is prone to collapse) of the active area AA.

The dam disposed in the dam area DA may be a pattern to be connected entirely, or may be formed of two or more patterns that are disconnected. Furthermore, in the dam area DA, only a first dam may be disposed, two dams (for example, a first dam and a second dam) may be disposed, or three or more dams may be disposed. The number of dams does not limit the content of the present disclosure.

In the dam area DA, there may be only the first dam in one direction, and both the first dam and the second dam may be in the other direction.

Figure 3:
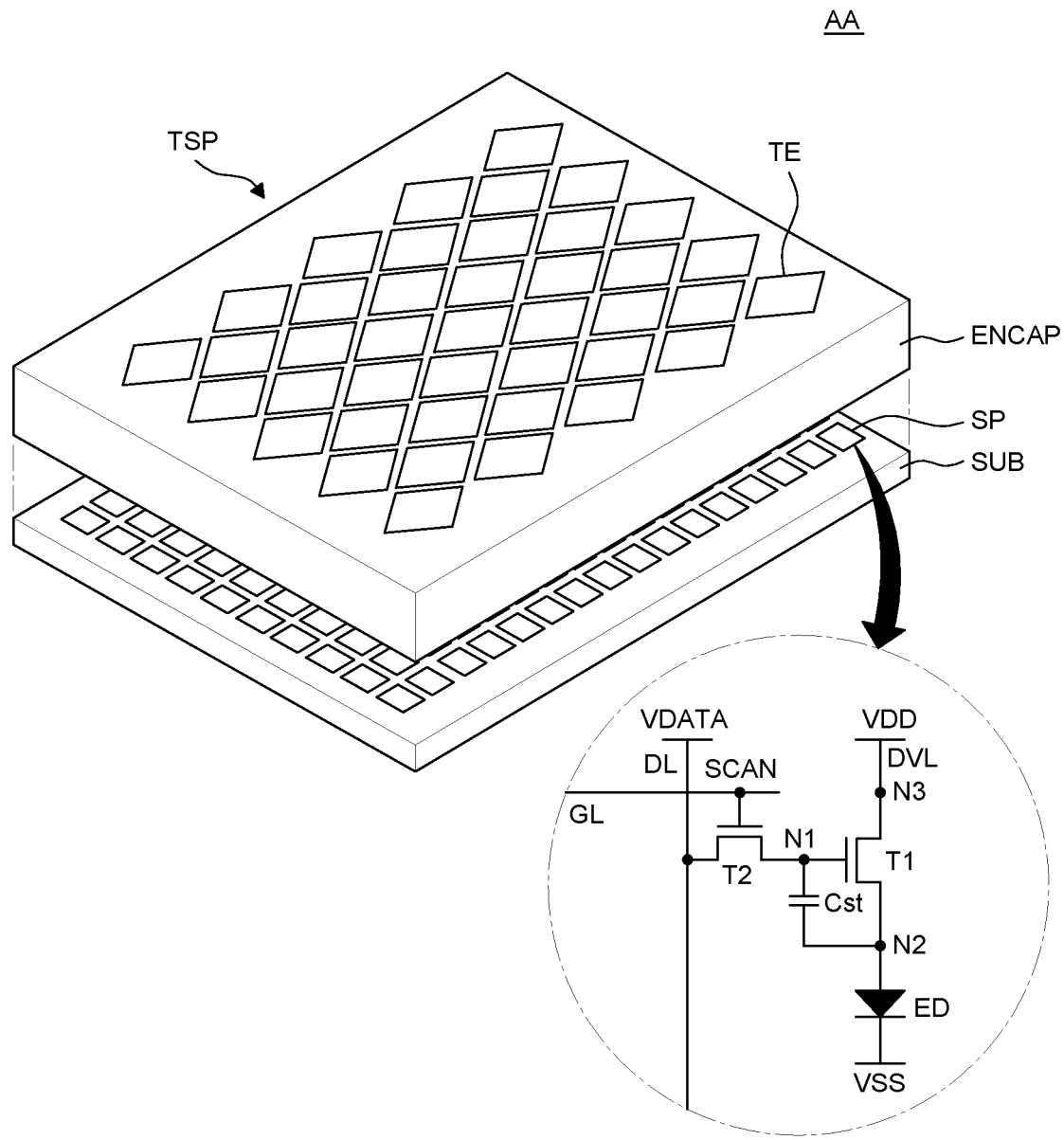
FIG. 3 illustrates a structure in which a touch panel is built in the display panel according to an embodiment of the present disclosure.

FIG. 3 illustrates a structure in which a touch panel is built in the display panel according to an embodiment of the present disclosure.

With reference to FIG. 3, in the active area AA of the display panel DISP, a plurality of sub-pixels SP are disposed on a substrate SUB.

Each sub-pixel SP may include a light emitting element ED, a first transistor T1 for driving the light emitting element ED, a second transistor T2 for transferring a data voltage VDATA to a first node N1 of the first transistor T1, and a storage capacitor Cst for maintaining a constant voltage for one frame.

The first transistor T1 may include the first node N1 to which the data voltage VDATA may be applied, a second node N2 electrically connected to the light emitting element ED, and a third node N3 to which a driving voltage VDD from a driving voltage line DVL is applied. The first node N1 may be a gate node, the second node N2 may be a source node or a drain node, and the third node N3 may be a drain node or a source node, and they are not limited thereto. The first transistor T1 may be a driving transistor for driving the light emitting element ED, but is not limited thereto.

The light emitting element ED may include a first electrode (e.g., an anode), a light emitting layer, and a second electrode (e.g., a cathode). The first electrode may be electrically connected to the second node N2 of the first transistor T1, and a ground voltage VSS may be applied to the second electrode.

In the light emitting element ED, the light emitting layer may be an organic light emitting layer including an organic material. For example, the light emitting element ED may be an organic light emitting diode (OLED).

The second transistor T2 may be turned on and off by a scan signal SCAN that is applied through a gate line GL, and be electrically connected between the first node N1 of the first transistor T1 and a data line DL. The second transistor T2 may be a switching transistor and is not limited thereto.

When the second transistor T2 is turned on by the scan signal SCAN, the second scan transistor T2 transfers the data voltage VDATA supplied from the data line DL to the first node N1 of the first transistor T1.

The storage capacitor Cst may be electrically connected between the first node N1 and the second node N2 of the first transistor T1.

Each sub-pixel SP may have a 2T1C structure including two transistors T1 and T2 and one capacitor Cst as shown in FIG. 3, but is not limited thereto. For example, it may further include at least one transistor or further include at least one capacitor.

The storage capacitor Cst is not a parasitic capacitor (e.g., Cgs, Cgd) that is an internal capacitor capable of existing between the first node N1 and the second node N2 of the first transistor T1, and may be an external capacitor additionally designed in an outside of the first transistor T1.

Each of the first transistor T1 and the second transistor T2 may be an n-type transistor or a p-type transistor.

As described above, circuit elements such as the light emitting element ED, two or more transistors T1 and T2 and at least one capacitor Cst are disposed on the display panel DISP. Since the circuit element (e.g., the light emitting element ED) is vulnerable to external moisture or oxygen, an encapsulation unit ENCAP (e.g., encapsulation layer) for preventing external moisture or oxygen from penetrating into the circuit element (in particular, the light emitting element ED) may be disposed on the display panel DISP.

The encapsulation unit ENCAP may be configured as one layer but may be configured as a plurality of layers, but is not limited thereto.

In the display device according to the embodiment of the present disclosure, the touch panel TSP may be formed on the encapsulation unit ENCAP.

For example, in the display device, a touch sensor structure such as a plurality of touch electrodes TE constituting the touch panel TSP may be disposed on the encapsulation unit ENCAP.

During touch sensing, the touch driving signal TDS or a touch sensing signal may be applied to the touch electrode TE. Accordingly, during touch sensing, a potential difference is formed between the touch electrode TE and the cathode disposed with the encapsulation unit ENCAP interposed therebetween, so that unnecessary parasitic capacitance may be formed. Since parasitic capacitance may reduce touch sensitivity, in order to reduce parasitic capacitance, a distance between the touch electrode TE and the cathode may be a predetermined value (e.g., 1 μm) or more in consideration of a panel thickness, a panel manufacturing process, and display performance, but is not limited thereto. For example, a thickness of the encapsulation unit ENCAP may be at least 1 μm, but is not limited thereto.

Figure 4:
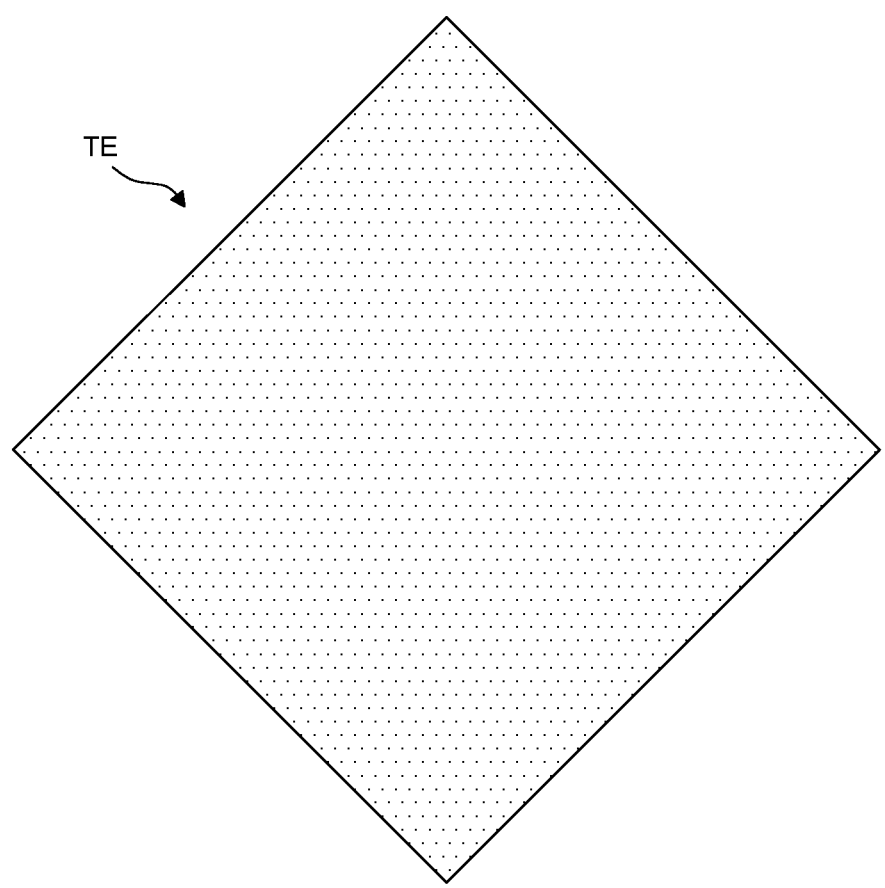
FIG. 4 illustrates a touch electrode disposed on the display panel according to an embodiment of the present disclosure.
Figure 5:
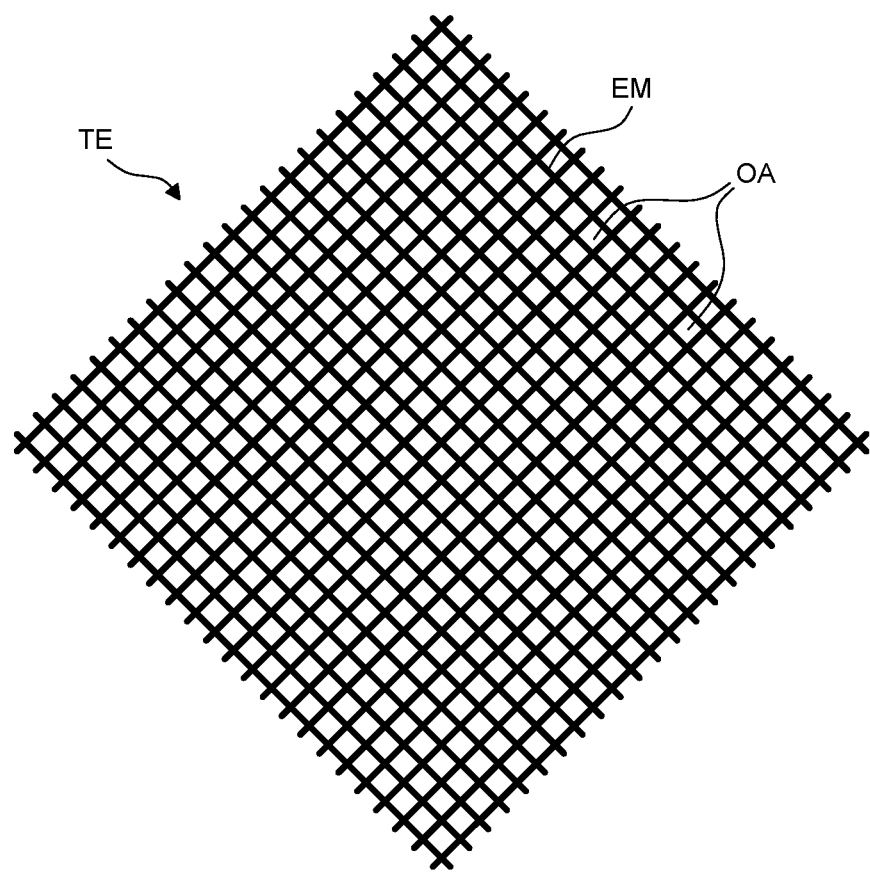
FIG. 5 illustrates a touch electrode disposed on the display panel according to an embodiment of the present disclosure.

FIGS. 4 and 5 are views illustrating touch electrodes disposed on the display panel DISP according to an embodiment of the present disclosure.

As illustrated in FIG. 4, each touch electrode TE disposed on the display panel DISP may be a plate-shaped electrode metal having no opening. In this case, each touch electrode TE may be a transparent electrode. For example, each touch electrode TE may be formed of a transparent electrode material so that light emitted from the plurality of sub-pixels SP disposed below may be transmitted upwardly.

As another example, as shown in FIG. 5, each touch electrode TE disposed on the display panel DISP may be an electrode metal EM having two or more openings OA by being patterned into a mesh type.

The electrode metal EM may be a portion corresponding to a substantial touch electrode TE, and the electrode metal EM may be a portion to which the touch driving signal TDS is applied or in which a touch sensing signal is sensed.

As illustrated in FIG. 5, when each touch electrode TE is an electrode metal EM patterned in a mesh type, two or more openings OA may exist in an area of the touch electrode TE.

Each of the two or more openings OA present in each touch electrode TE may correspond to a light emitting area of at least one sub-pixel SP. For example, the plurality of openings OA may be paths through which light emitted from the plurality of sub-pixels SP disposed below passes upwardly. Hereinafter, each touch electrode TE will be described as an example of electrode metal EM having a mesh type.

The electrode metal EM corresponding to each touch electrode TE may be positioned on a bank disposed in an area other than light emitting areas of two or more sub-pixels SP.

In a method of forming the plurality of touch electrodes TE, after the electrode metal EM is widely formed in a mesh shape, the electrode metal EM may be cut into a predetermined pattern to electrically separate the electrode metal EM, thereby forming the plurality of touch electrodes TE.

As shown in FIGS. 4 and 5, an outline shape of the touch electrode TE may be a quadrangular shape such as a diamond shape or a rhombus shape, or may have various shapes such as a triangle shape, a pentagon shape or a hexagon shape, but is not limited thereto.

Figure 6:
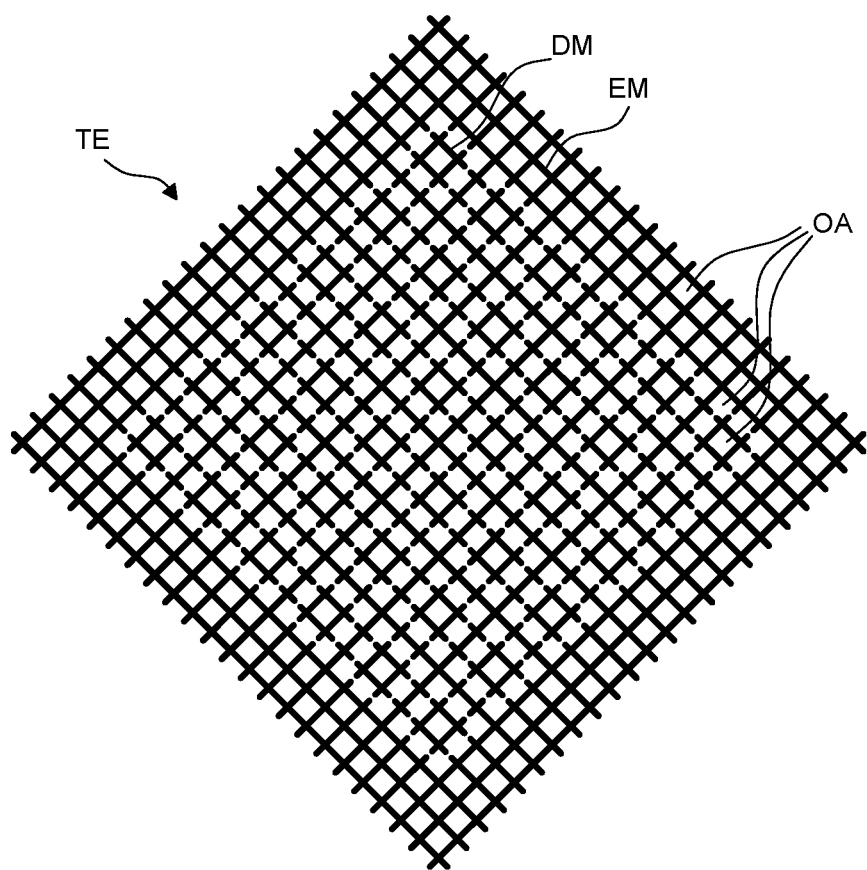
FIG. 6 illustrates a mesh type of the touch electrode of FIG. 5 according to an embodiment of the present disclosure.

FIG. 6 illustrates a mesh type of the touch electrode of FIG. 5 according to one embodiment.

With reference to FIG. 6, in an area of each touch electrode TE, at least one dummy metal DM that is disconnected from the mesh type electrode metal EM may exist.

The electrode metal EM is a portion corresponding to a substantial touch electrode TE and may be a portion to which the touch driving signal TDS is applied or in which a touch sensing signal is sensed. The dummy metal DM may be a portion that is within the area of the touch electrode TE but the touch driving signal TDS may not be applied thereto and the touch sensing signal may not be sensed therein. For example, the dummy metal DM may be an electrically floating metal. Accordingly, the electrode metal EM may be electrically connected to the touch driving circuit TDC, but the dummy metal DM may not be electrically connected to the touch driving circuit TDC.

The at least one dummy metal DM may exist in a state of being disconnected from the electrode metal EM in the area of each of all the touch electrodes TE.

As another example, at least one dummy metal DM may exist in the state of being disconnected from the electrode metal EM only in the area of each of some touch electrodes among all the touch electrodes TE. For example, the dummy metal DM may not exist in the areas of some touch electrodes TE.

As shown in FIG. 5, with regard to a role of the dummy metal DM, when in the area of the touch electrode TE, the at least one dummy metal DM does not exist and only the electrode metal EM exists as the mesh type, a visibility problem in which a contour of the electrode metal EM is visible on a screen can occur.

In connection with this, as shown in FIG. 6, when the at least one dummy metal DM is present in the area of the touch electrode TE, the visibility problem in which the contour of the electrode metal EM is visible on the screen may be prevented.

The touch sensitivity may be improved through adjusting a size of capacitance for each touch electrode TE by adjusting presence or absence or the number (a dummy metal ratio) of the dummy metals DM for each touch electrode TE.

By cutting some points in the electrode metal EM formed in the area of one touch electrode TE, a cut electrode metal EM may be formed as the dummy metal DM. For example, the electrode metal EM and the dummy metal DM may be formed on the same layer and formed of the same material.

The display device according to the embodiment of the present disclosure may sense a touch based on capacitance formed in the touch electrode TE.

The display device according to an embodiment of the present disclosure is in a capacitance-based touch sensing method, and may sense a touch in a mutual-capacitance-based touch sensing method, or may sense a touch in a self-capacitance-based touch sensing method, but is not limited thereto.

In the case of the mutual-capacitance-based touch sensing method, the plurality of touch electrodes TE may be classified into a driving touch electrode (a transmission touch electrode) to which the touch driving signal TDS is applied, and a sensing touch electrode (a receiving touch electrode) in which a touch sensing signal is detected and which forms capacitance with the driving touch electrode.

In the case of the mutual-capacitance-based touch sensing method, the touch sensing circuit TSC senses presence or absence of a touch and/or touch coordinates based on a change in capacitance (mutual-capacitance) between the driving touch electrode and the sensing touch electrode in accordance with presence or absence of a pointer such as a finger, a pen and the like.

In the case of the self-capacitance-based touch sensing method, each touch electrode TE can serve as both the driving touch electrode and the sensing touch electrode. For example, the touch sensing circuit TSC applies the touch driving signal TDS to at least one touch electrode TE and detects the touch sensing signal through the touch electrode TE to which the touch driving signal TDS is applied. And, based on the detected touch sensing signal, the touch sensing circuit TSC may sense presence or absence of a touch and/or touch coordinates by figuring out a change in capacitance between the touch electrode TE and the pointer such as the finger and the pen. In the self-capacitance-based touch sensing method, there is no distinction between the driving touch electrode and the sensing touch electrode.

In this manner, the display device according to the embodiment of the present disclosure may sense a touch by the mutual-capacitance-based touch sensing method or may sense a touch by the self-capacitance-based touch sensing method. Hereinafter, a description will be given of an example in which the display device performs mutual-capacitance-based touch sensing and has a touch sensor structure for this.

Figure 7:
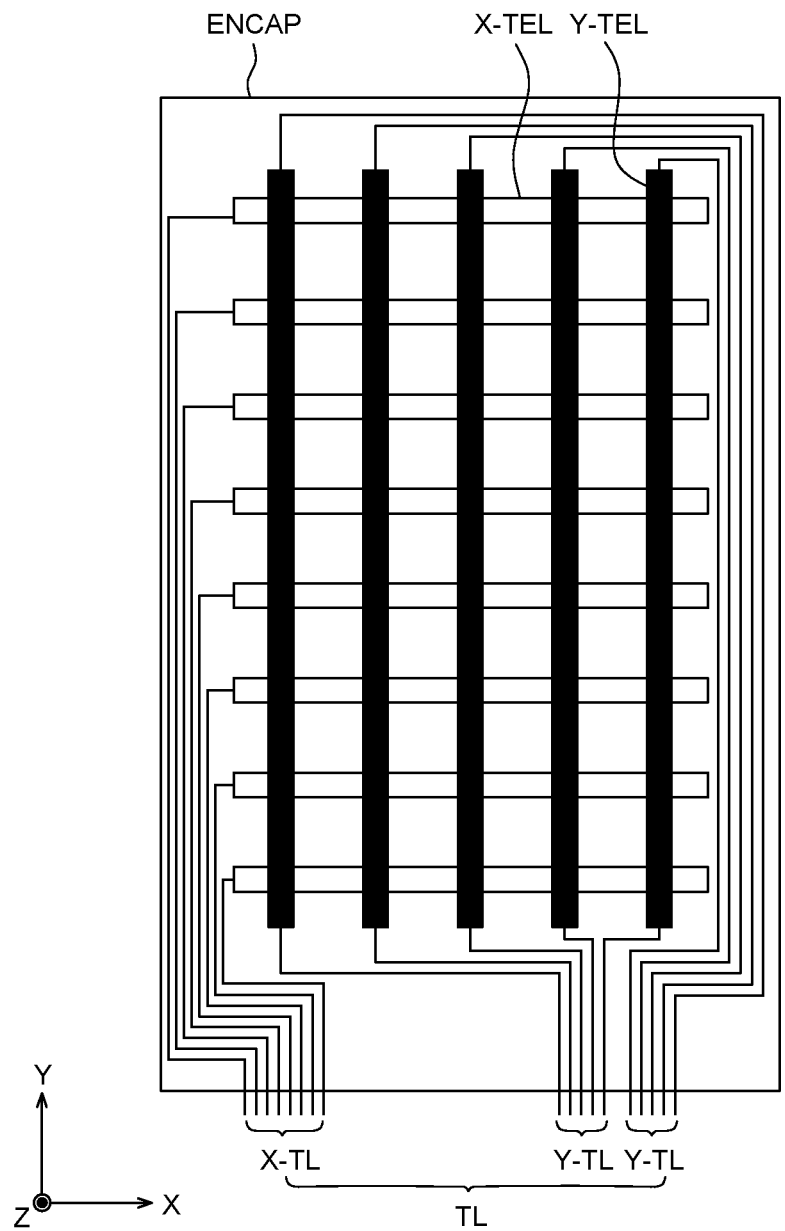
FIG. 7 illustrates a touch sensor structure in the touch panel according to an embodiment of the present disclosure.

FIG. 7 is a diagram illustrating a touch sensor structure in the touch panel according to an embodiment of the present disclosure.

With reference to FIG. 7, a touch sensor structure for mutual-capacitance-based touch sensing may include a plurality of X-touch electrode lines X-TEL and a plurality of Y-touch electrode lines Y-TEL. For example, the plurality of X-touch electrode lines X-TEL and the plurality of Y-touch electrode lines Y-TEL may be positioned on the encapsulation unit ENCAP.

Each of the plurality of X-touch electrode lines X-TEL may be disposed in a first direction, and each of the plurality of Y-touch electrode lines Y-TEL may be disposed in a second direction different from the first direction.

In the present disclosure, the first direction and the second direction may be relatively different from each other, for example, the first direction may be an x-axis direction and the second direction may be a y-axis direction. Conversely, the first direction may be a y-axis direction and the second direction may be an x-axis direction. In addition, the first direction and the second direction may be orthogonal to each other, but may not be orthogonal to each other. In addition, in the present disclosure, rows and columns are relative, and rows and columns may be interchanged.

Each of the plurality of X-touch electrode lines X-TEL may include a plurality of X-touch electrodes X-TE that are electrically connected. Each of the plurality of Y-touch electrode lines Y-TEL may include a plurality of Y-touch electrodes Y-TE that are electrically connected. For example, the plurality of X-touch electrodes X-TE and the plurality of Y-touch electrodes Y-TE may be electrodes which are included in the plurality of touch electrodes TE and roles (functions) of which are distinguished.

For example, the plurality of X-touch electrodes X-TE constituting each of the plurality of X-touch electrode lines X-TEL may be driving touch electrodes, and the plurality of Y-touch electrodes Y-TE constituting each of the plurality of Y-touch electrode lines Y-TEL may be sensing touch electrodes. For example, each of the plurality of X-touch electrode lines X-TEL may correspond to a driving touch electrode line, and each of the plurality of Y-touch electrode lines Y-TEL may correspond to a sensing touch electrode line.

Conversely, the plurality of X-touch electrodes X-TE constituting each of the plurality of X-touch electrode lines X-TEL may be sensing touch electrodes, and the plurality of Y-touch electrodes Y-TE constituting each of the plurality of Y-touch electrode lines Y-TEL may be driving touch electrodes. For example, each of the plurality of X-touch electrode lines X-TEL may correspond to a sensing touch electrode line, and each of the plurality of Y-touch electrode lines Y-TEL may correspond to a driving touch electrode line.

A touch sensor metal for touch sensing may include a plurality of touch routing lines TL in addition to the plurality of X-touch electrode lines X-TEL and the plurality of Y-touch electrode lines Y-TEL.

The plurality of touch routing lines TL may include at least one X-touch routing line X-TL connected to each of the plurality of X-touch electrode lines X-TEL, and at least one Y-touch routing line Y-TL connected to each of the plurality of Y-touch electrode lines Y-TEL.

Figure 8:
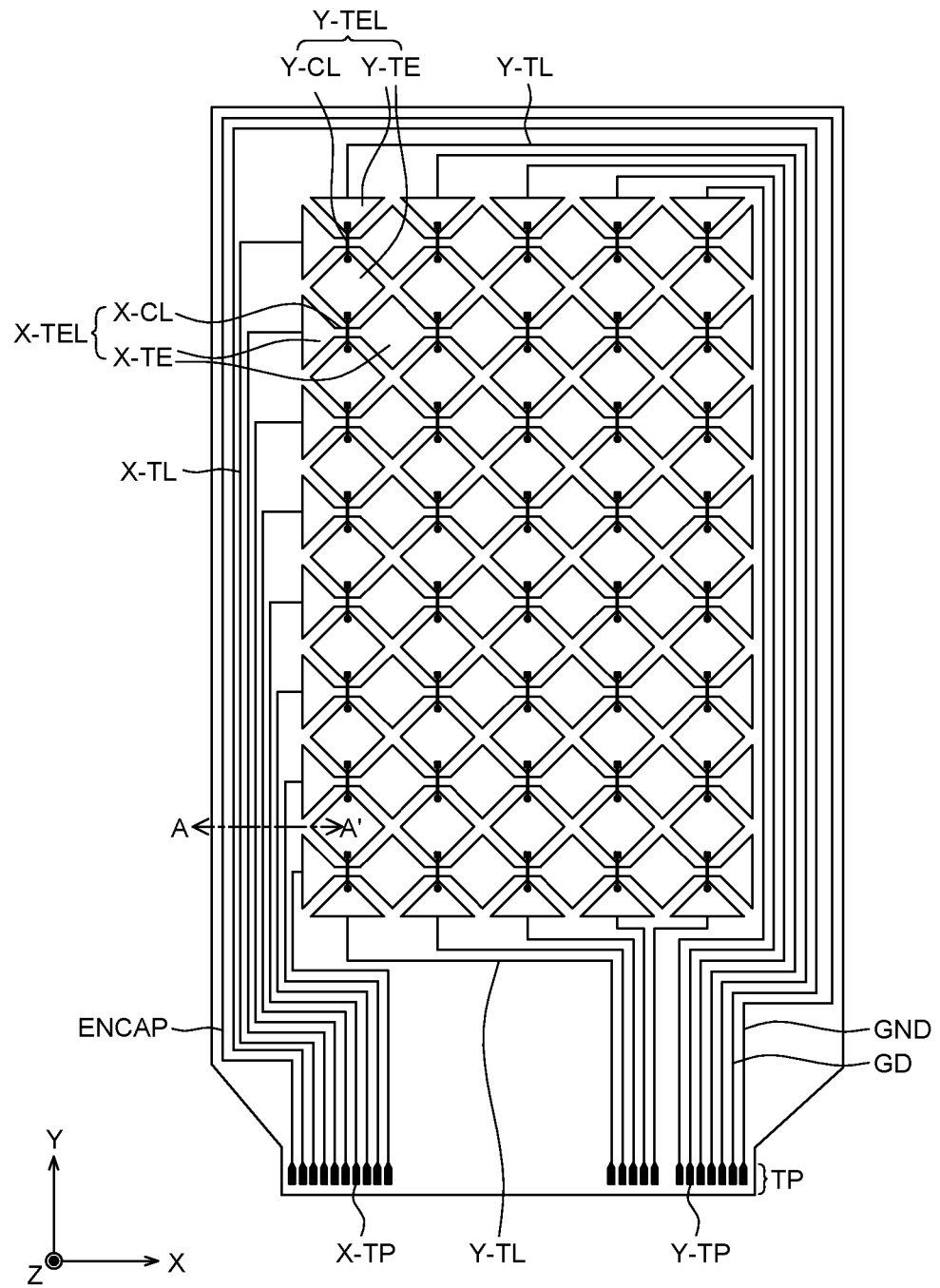
FIG. 8 is a diagram in which the touch sensor structure of FIG. 7 is implemented according to an embodiment of the present disclosure.

FIG. 8 is a diagram in which the touch sensor structure of FIG. 7 is implemented according to one embodiment.

With reference to FIG. 8, each of the plurality of X-touch electrode lines X-TEL may include the plurality of X-touch electrodes X-TE disposed in the same row (or column), and at least one X-touch electrode connection line X-CL electrically connecting together the plurality of X-touch electrodes X-TE. Here, the X-touch electrode connection line X-CL connecting two adjacent X-touch electrodes X-TE may be a metal integrated with the two adjacent X-touch electrodes X-TE, or may be a metal connected to the two adjacent X-touch electrodes X-TE through a contact hole.

Each of the plurality of Y-touch electrode lines Y-TEL may include the plurality of Y-touch electrodes Y-TE disposed in the same column (or row), and at least one Y-touch electrode connection line Y-CL electrically connecting together the plurality of Y-touch electrodes Y-TE. Here, the Y-touch electrode connection line Y-CL connecting two adjacent Y-touch electrodes Y-TE may be a metal integrated with the two adjacent Y-touch electrodes Y-TE, or may be a metal connected to the two adjacent Y-touch electrodes Y-TE through a contact hole.

In an area where the X-touch electrode line X-TEL and the Y-touch electrode line Y-TEL intersect (a touch electrode line intersection area), the X-touch electrode connection line X-CL and the Y-touch electrode connection line Y-CL may intersect with each other. In the touch electrode line intersection area, when the X-touch electrode connection line X-CL and the Y-touch electrode connection line Y-CL intersect, the X-touch electrode connection line X-CL and the Y-touch electrode connection line Y-CL need to be located on different layers.

In order to dispose the plurality of X-touch electrode lines X-TEL and the plurality of Y-touch electrode lines Y-TEL so as to intersect with each other, the plurality of X-touch electrodes X-TE, a plurality of the X-touch electrode connection lines X-CL, the plurality of Y-touch electrodes Y-TE, and a plurality of the Y-touch electrode connection lines Y-CL may be located in two or more layers.

With reference to FIG. 8, each of the plurality of X-touch electrode lines X-TEL is electrically connected to a corresponding X-touch pad X-TP through at least one X-touch routing line X-TL. For example, an outermost X-touch electrode X-TE among the plurality of X-touch electrodes X-TE included in one X-touch electrode line X-TEL is electrically connected to a corresponding X-touch pad X-TP through the X-touch routing line X-TL.

Each of the plurality of Y-touch electrode lines Y-TEL is electrically connected to a corresponding Y-touch pad Y-TP through at least one Y-touch routing line Y-TL. For example, an outermost Y-touch electrode Y-TE among the plurality of Y-touch electrodes Y-TE included in one Y-touch electrode line Y-TEL is electrically connected to a corresponding Y-touch pad Y-TP through the Y-touch routing line Y-TL.

A third line GD surrounding an outside of an outermost X-touch routing line X-TL and an outermost Y-touch routing line Y-TL may be disposed, and a ground line GND surrounding the third line GD may be disposed. The third line GD is disposed between the outermost touch routing lines X-TL and Y-TL and the ground line GND, and may prevent a parasitic capacitance from being formed between the outermost touch routing lines X-TL and Y-TL and the ground line GND. The ground line GND is disposed outside the third line GD, and may protect the touch routing lines X-TL and Y-TL from static electricity introduced from the outside. The third line GD may be a guard line and is not limited thereto.

With reference to FIG. 8, the plurality of X-touch electrode lines X-TEL and the plurality of Y-touch electrode lines Y-TEL may be disposed on the encapsulation unit ENCAP. For example, the plurality of X-touch electrodes X-TE and the plurality of X-touch electrode connection lines X-CL constituting the plurality of X-touch electrode lines X-TEL may be disposed on the encapsulation unit ENCAP. The plurality of X-touch electrodes X-TE and the plurality of X-touch electrode connection lines X-CL constituting the plurality of X-touch electrode lines X-TEL may be disposed on the encapsulation unit ENCAP.

Each of the plurality of X-touch routing lines X-TL electrically connected to the plurality of X-touch electrode lines X-TEL are disposed on the encapsulation unit ENCAP and extend to a place where there is no encapsulation unit ENCAP, so that they may be electrically connected to the plurality of X-touch pads X-TP. Each of the plurality of Y-touch routing lines Y-TL electrically connected to the plurality of Y-touch electrode lines Y-TEL are disposed on the encapsulation unit ENCAP and extend to a place where there is no encapsulation unit ENCAP, so that they may be electrically connected to the plurality of Y-touch pads Y-TP. Here, the encapsulation unit ENCAP may be located in the active area AA, and in another embodiment, the encapsulation unit ENCAP may extend to the non-active area NA.

The third line GD and the ground line GND may be disposed on the encapsulation unit ENCAP and extend to a portion where the encapsulation unit ENCAP is not disposed. Each of the third line GD and the ground line GND may be electrically insulated from the touch routing lines X-TL and Y-TL.

Figure 9:
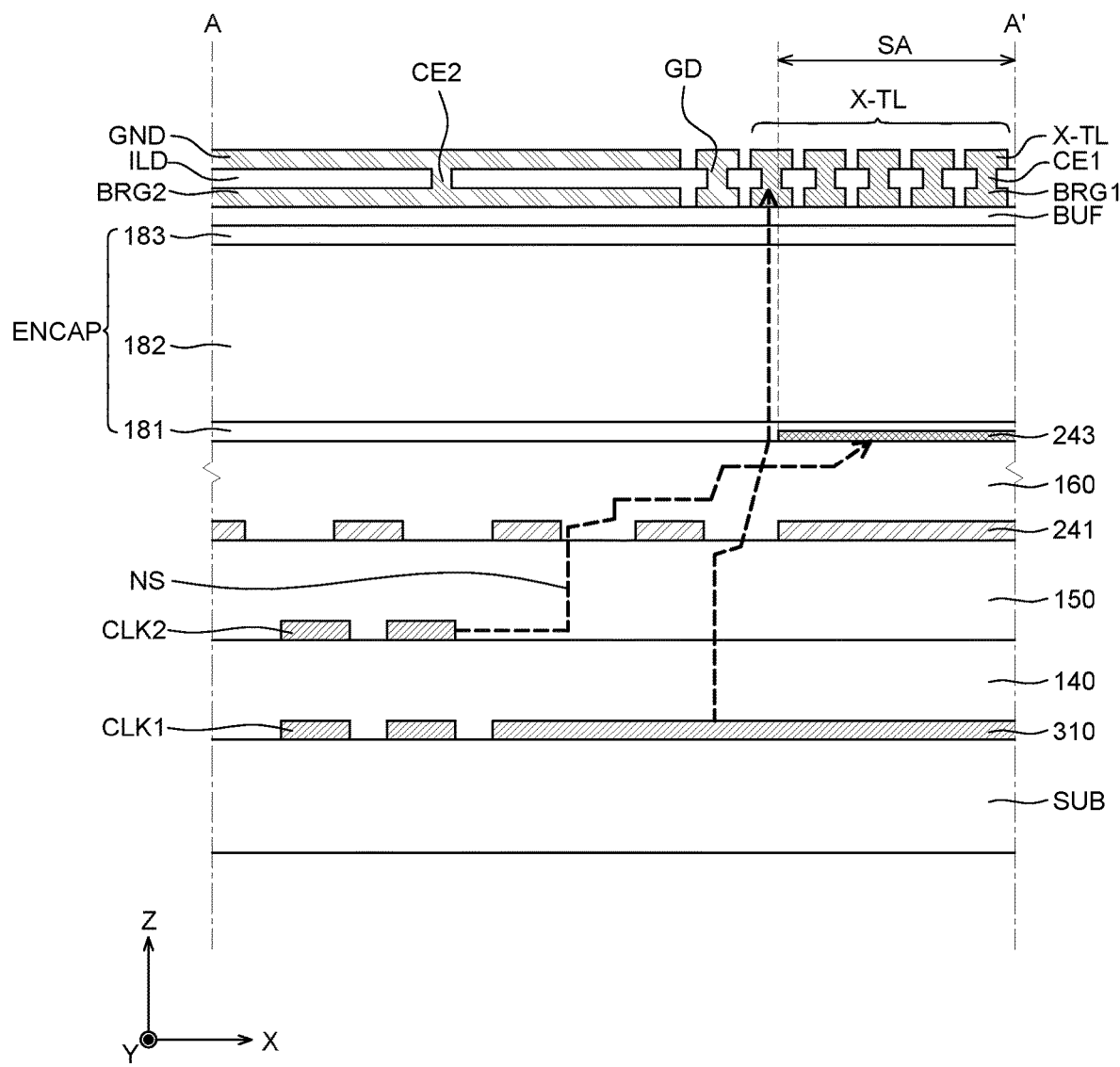
FIG. 9 is a cross-sectional view taken along cutting line A-A' of FIG. 8 according to an embodiment of the present disclosure.

FIG. 9 is a cross-sectional view taken along cutting line A-A' of FIG. 8 according to one embodiment.

With reference to FIG. 9, a cross-section of a non-active area (or non-display area) NA of the display device according to an embodiment of the present disclosure is illustrated. A plurality of signal lines, electrodes of the light emitting element ED, the encapsulation unit ENCAP, and the touch routing lines X-TL may be disposed on the substrate SUB.

With reference to FIG. 9, a plurality of signal lines are disposed on the non-active area NA of the substrate SUB. The plurality of signal lines include an emission/scan signal driver 310 and various clock signal lines CLK1 and CLK2, but are not limited thereto. The emission/scan signal driver 310 and various clock signal lines CLK1 and CLK2 may be disposed over several layers. For example, a portion of the clock signal lines CLK1 and the emission/scan signal driver 310 may be disposed between the substrate SUB and an inorganic insulating layer 140, and the other clock signal lines CLK2 may be disposed between the inorganic insulating layer 140 and a planarization layer 150, but the present disclosure is not limited thereto.

Above the plurality of signal lines, a portion of an anode 241 and a cathode 243 constituting the light emitting element ED in the active area AA may be disposed to extend (or expand) to the non-active area NA. A bank layer 160 may be disposed between the anode 241 and the cathode 243.

The encapsulation unit ENCAP may be disposed above the electrodes of the light emitting element ED. The encapsulation unit ENCAP may be configured by stacking a first inorganic insulating layer 181, an organic insulating layer 182, and a second inorganic insulating layer 183 in this order, but is not limited thereto. The encapsulation unit ENCAP disposed in the active area AA and the non-active area NA may be configured to have different shapes and different layers. For example, in the active area AA, it may be configured of the first inorganic insulating layer 181, the organic insulating layer 182, and the second inorganic insulating layer 183, and thicknesses of the respective insulating layers may be configured uniformly or identically over an entirety of the active area AA. For example, in the non-active area NA, the thickness of the organic insulating layer 182 may be configured to decrease toward an outside of the non-active area NA, but is not limited thereto.

The plurality of touch routing lines X-TL and Y-TL, the third line GD, and the ground line GND may be disposed above the encapsulation unit ENCAP.

The plurality of touch routing lines (or first lines) X-TL and Y-TL may electrically connect the plurality of touch electrode lines X-TEL and Y-TEL and the corresponding X-touch pads X-TP and Y-TP. Since the plurality of touch routing lines X-TL and Y-TL supply the touch driving signal TDS to the plurality of touch electrode lines X-TEL and Y-TEL of the active area AA, they may be disposed at an inside of the non-active area NA (e.g., close to a side of the non-active area NA in contact with the active area AA).

The plurality of touch routing lines X-TL and Y-TL may be connected to a plurality of first auxiliary lines (or bridge lines) BRG1 through corresponding first connection electrodes (or first electrodes) CE1. The first auxiliary lines BRG1 may be bridge lines or touch electrode connection lines X-CL and Y-CL, but are not limited thereto. By connecting the plurality of first auxiliary lines BRG1 to the plurality of touch routing lines X-TL and Y-TL, performance degradation due to a reduction in resistance of the plurality of touch routing lines X-TL and Y-TL of a single layer may be compensated. For example, since the plurality of touch routing lines X-TL and Y-TL are electrically connected to the plurality of first auxiliary lines BRG1 and become double-layered lines, a sufficiently high voltage of the touch driving signal TDS may be applied thereto by increasing line resistance. The plurality of first auxiliary lines BRG1 may be configured to have the same shape or the same area as the plurality of touch routing lines X-TL and Y-TL, but are not limited thereto.

The ground line (a second line) GND may be disposed at an outside (or outer periphery) of the non-active area NA. The ground line GND is disposed at the outer periphery of the non-active area NA, and may be disposed to be spaced apart from the plurality of touch routing lines X-TL and Y-TL. The ground line GND grounds static electricity that is introduced from the outside of the display device to the plurality of touch routing lines X-TL and Y-TL, so that it can prevent or at least reduce malfunction due to an application of electrostatic voltage to the plurality of touch routing lines X-TL and Y-TL or the plurality of touch electrode lines X-TEL and Y-TEL.

The ground line GND may be connected to a second auxiliary line (or a lower line) BRG2 through a second connection electrode (or a second electrode) CE2. By connecting the second auxiliary line BRG2 to the ground line GND, touch performance degradation due to a decrease in resistance of the ground line GND of a single layer may be compensated. For example, since the ground line GND is electrically connected to a plurality of second auxiliary lines BRG2 and becomes a double-layer line, a sufficiently high static electricity may be grounded by increasing line resistance. The second auxiliary line BRG2 may be configured to have the same shape or the same area as the ground line GND, but is not limited thereto.

The third line GD may be disposed between the ground line GND and the plurality of touch routing lines X-TL and Y-TL. The third line GD is disposed between the ground line GND and the plurality of touch routing line X-TL and Y-TL, and may prevent or at least reduce a parasitic capacitance from being formed between the ground line GND and the plurality of touch routing line X-TL and Y-TL. The third line GD may have a double-layered line structure by placing lines at an underlying portion like the touch routing lines X-TL and Y-TL and connecting them with a connection electrode. The lower line may have the same shape or the same area as the third line GD, but is not limited thereto.

An interlayer insulating layer ILD may be disposed between the plurality of touch routing lines X-TL and Y-TL and the plurality of first auxiliary lines BRG1. A plurality of the first connection electrodes CE1 may be electrically connected to the plurality of touch routing lines X-TL and Y-TL and the plurality of first auxiliary lines BRG1 through contact holes formed in the interlayer insulating layer ILD.

The interlayer insulating layer ILD may be disposed between the ground line GND and the second auxiliary line BRG2. The ground line GND and the second auxiliary line BRG2 may be electrically connected to each other through a contact hole formed in the interlayer insulating layer ILD.

The interlayer insulating layer ILD may be disposed between the third line GD and the line at the lower portion of the third line GD. The third line GD and the lower line of the third line GD may be electrically connected to each other through a contact hole formed in the interlayer insulating layer ILD.

The plurality of touch routing lines X-TL and Y-TL, the ground line GND, and the third line GD may be formed of the same material by the same (or a single) process, and each of the plurality of touch routing lines may be formed of the same material. Each of the plurality of touch routing lines X-TL and Y-TL, the ground line GND, and the third line GD may be electrically insulated from each other, but is not limited thereto. The plurality of first connection electrodes CE1, second connection electrodes CE2, and connection electrodes may be formed of the same material by the same process. The plurality of first auxiliary lines BRG1, the second auxiliary lines BRG2, and the lower line may be formed of the same material by the same process, and each of plurality of first auxiliary lines BRG1, the second auxiliary lines BRG2, and the lower line may be electrically insulated from each other, but is not limited thereto.

With reference to FIG. 9, the emission/scan signal driver 310 and various clock signal lines CLK1 and CLK2 may be driven to radiate electromagnetic waves. The radiated electromagnetic wave acts as an electrical noise NS to the plurality of touch routing lines X-TL and Y-TL. For example, among the electromagnetic waves radiated from the emission/scan signal driver 310 and the various clock signal lines CLK1 and CLK2, electromagnetic waves traveling in an upward direction (or a Z-axis direction) may pass through the inorganic insulating layer 140, the planarization layer 150, the bank layer 160, and the encapsulation unit ENCAP and be transmitted to the ground line GND, the second auxiliary line BRG2, the third line GD, the plurality of touch routing lines X-TL and Y-TL and/or the plurality of first auxiliary lines BRG1 to thereby act as electrical noise NS. In FIG. 9, the electrical noise NS is expressed as moving in a dotted line direction, but is not limited to an arrow direction.

The electrical noise NS generated in the plurality of signal lines may be transmitted to the ground line GND, the second auxiliary line BRG2, and the third line GD. Since both the ground line GND and the third line GD are in electrically floating state, the ground line GND and the third line GD may not be affected by the transmitted electrical noise NS.

The electrical noise NS generated in the plurality of signal lines may be transmitted to the plurality of touch routing lines X-TL and Y-TL and the plurality of first auxiliary lines BRG1. Due to the transmitted electrical noise NS, unwanted capacitance is generated in the plurality of touch routing lines X-TL and Y-TL and the plurality of touch electrodes X-TE and Y-TE connected thereto, thereby leading to a decrease in touch performance.

The electrical noise NS generated in the plurality of signal lines may be prevented or at least reduced by the cathode 243. The cathode 243 may simultaneously perform a function of an electrode for driving the light emitting element ED and a function of a low potential voltage source. When the cathode 243 serves as a low potential voltage source, it is possible to absorb and block electrical noise NS generated in the plurality of signal lines.

The electrical noise NS blocked by the cathode 243 may not reach a part of the plurality of touch routing lines X-TL and Y-TL. For example, a shielding area SA in which the electrical noise NS to be transmitted to the plurality of touch routing lines X-TL and Y-TL is blocked by the cathode 243 may be formed. The shielding area SA may be formed over a part or all of the plurality of touch routing lines X-TL and Y-TL. With reference to FIG. 9, although the shielding area SA is illustrated as being parallel to the upward direction (or the Z-axis direction), the electrical noise NS, which is an electromagnetic wave, can radiate in an omni-directional direction, and thus is not limited thereto. For example, the shielding area SA may be widened or narrowed in the upward direction by forming an angle with the Z-axis direction. In the cross-sectional view of FIG. 9, the shielding area SA may have a quadrangular shape or a rhombus shape having the cathode 243 as a bottom surface (or a lower surface), and the shape is not limited thereto.

Since the shielding area SA is not a fixed area, even if an area of the cathode 243 is smaller or larger than an area in which the plurality of touch routing lines X-TL and Y-TL are formed, a part of the plurality of touch routing lines X-TL and Y-TL may be exposed to the electrical noise NS. For example, the cathode 243 extending to the non-active area NA may not be formed to an intended area when a tolerance due to a process increases. Accordingly, a part of the plurality of touch routing lines X-TL and Y-TL may be in a state vulnerable to the electrical noise NS.

Figure 10:
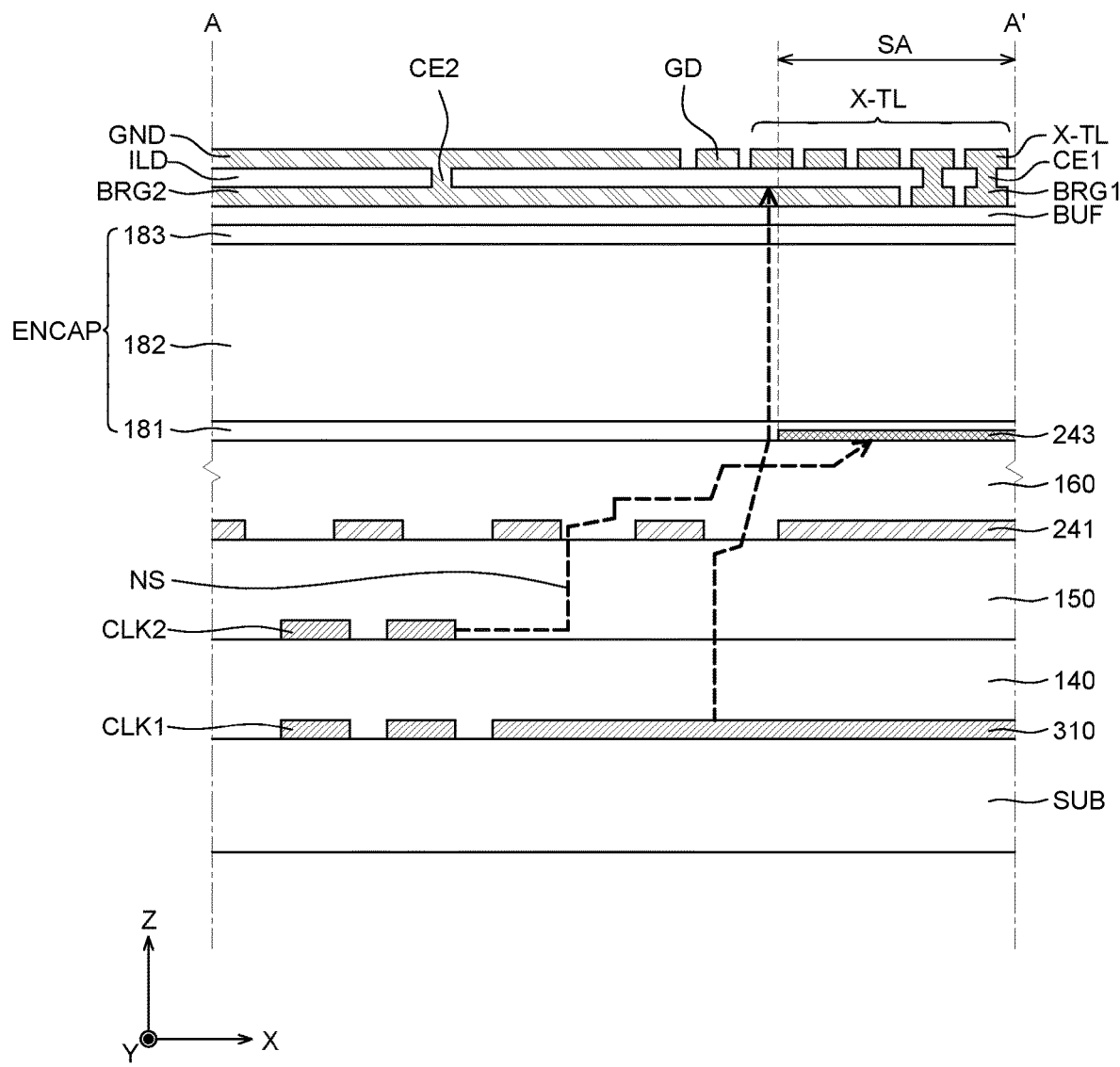
FIG. 10 is another cross-sectional view taken along cutting line A-A' of FIG. 8 according to an embodiment of the present disclosure.

FIG. 10 is another cross-sectional view taken along cutting line A-A of FIG. 8 according to another embodiment. That is, FIG. 10 is a cross-sectional view taken along cutting line A-A' of FIG. 8 according to another embodiment of the present disclosure.

With reference to FIG. 10, a plurality of signal lines, electrodes of the light emitting element ED, the encapsulation unit ENCAP, and the touch routing lines X-TL and Y-TL are disposed on the substrate SUB. Among components disposed in the non-active area NA of FIG. 10, descriptions of the same components as those illustrated in FIG. 9 may be omitted or simplified.

With reference to FIG. 10, a plurality of signal lines are disposed on the non-active area NA of the substrate SUB. The plurality of signal lines include the emission/scan signal driver 310 and various clock signal lines CLK1 and CLK2, but are not limited thereto.

Above the plurality of signal lines, a portion of the anode 241 and the cathode 243 constituting the light emitting element ED in the active area AA may be disposed to extend (or expand) to the non-active area NA. The bank layer 160 may be disposed between the anode 241 and the cathode 243.

The encapsulation unit ENCAP may be disposed above the electrodes of the light emitting element ED. The encapsulation unit ENCAP may be configured by stacking the first inorganic insulating layer 181, the organic insulating layer 182, and the second inorganic insulating layer 183 in the order, but is not limited thereto.

The plurality of touch routing lines X-TL and Y-TL, the third line GD, and the ground line GND may be disposed above the encapsulation unit ENCAP.

The plurality of touch routing lines (or first lines) X-TL and Y-TL may electrically connect the plurality of touch electrode lines X-TEL and Y-TEL and the corresponding X-touch pads X-TP and Y-TP. Since the plurality of touch routing lines X-TL and Y-TL supply the touch driving signal TDS to the plurality of touch electrode lines X-TEL and Y-TEL of the active area AA, they may be disposed at an inside of the non-active area NA (e.g., close to a side of the non-active area NA in contact with the active area AA).

A part of the plurality of touch routing lines X-TL and Y-TL may be connected to the plurality of first auxiliary lines (or bridge lines) BRG1 through the corresponding first connection electrodes (or first electrodes) CE1. The first auxiliary lines BRG1 may be bridge lines or touch electrode connection lines X-CL and Y-CL, but are not limited thereto.

By connecting the plurality of first auxiliary lines BRG1 to a part of the plurality of touch routing lines X-TL and Y-TL, touch performance degradation due to a reduction in resistance of the plurality of touch routing lines X-TL and Y-TL of a single layer may be compensated. For example, since a part of the plurality of touch routing lines X-TL and Y-TL are electrically connected to the plurality of first auxiliary lines BRG1 and become double-layered lines, a sufficiently high voltage of the touch driving signal TDS may be applied thereto by increasing line resistance. The plurality of first auxiliary lines BRG1 may be configured to have the same shape or the same area as the plurality of touch routing lines X-TL and Y-TL, but are not limited thereto.

The ground line (a second line) GND may be disposed at an outside (or outer periphery) of the non-active area NA. The ground line GND is disposed at the outer periphery of the non-active area NA, and may be disposed to be spaced apart from the plurality of touch routing lines X-TL and Y-TL. The ground line GND grounds static electricity that is introduced from the outside of the display device and introduced to the plurality of touch routing lines X-TL and Y-TL, so that it can prevent or at least reduce malfunction due to an application of electrostatic voltage to the plurality of touch routing lines X-TL and Y-TL or the plurality of touch electrode lines X-TEL and Y-TEL.

The ground line GND may be connected to the second auxiliary line (or a lower line) BRG2 through the second connection electrode (or a second electrode) CE2. By connecting the second auxiliary line BRG2 to the ground line GND, touch performance degradation due to a decrease in resistance of the ground line GND of a single layer may be compensated. For example, since the ground line GND is electrically connected to the plurality of second auxiliary lines BRG2 and becomes a double-layer line, a sufficiently high static electricity may be grounded by increasing line resistance. The second auxiliary line BRG2 may be configured to have the same shape or the same area as the ground line GND, but is not limited thereto.

In the display device according to the embodiment of the present disclosure, the second auxiliary line BRG2 may be disposed to extend to an area under a part of the plurality of touch routing lines (or first lines) X-TL and Y-TL. For example, the second auxiliary line BRG2 may overlap the cathode 243 disposed to extend to the shielding area SA.

The third line GD may be disposed between the ground line GND and the plurality of touch routing lines X-TL and Y-TL. The third line GD is disposed between the ground line GND and the plurality of touch routing line X-TL and Y-TL, and may prevent a parasitic capacitance from being formed between the ground line GDN and the plurality of touch routing line X-TL and Y-TL.

The interlayer insulating layer ILD may be disposed between a part of the plurality of touch routing lines X-TL and Y-TL and the plurality of first auxiliary lines BRG1 corresponding to the plurality of touch routing lines X-TL and Y-TL. The plurality of first connection electrodes CE1 may be electrically connected to the part of the plurality of touch routing lines X-TL and Y-TL and the plurality of first auxiliary lines BRG1 corresponding to the plurality of touch routing lines X-TL and Y-TL through contact holes formed in the interlayer insulating layer ILD.

The interlayer insulating layer ILD may be disposed between the ground line GND and the second auxiliary line BRG2. The ground line GND and the second auxiliary line BRG2 may be electrically connected to each other through a contact hole formed in the interlayer insulating layer ILD.

Since the second auxiliary line BRG2 according to the embodiment of the present disclosure is disposed to extend to a part of the plurality of touch routing lines X-TL and Y-TL, the interlayer insulating layer ILD may be disposed between the second auxiliary line BRG2 and the third line GD, and a part of the plurality of touch routing lines X-TL and Y-TL.

The plurality of touch routing lines X-TL and Y-TL, the ground line GND, and the third line GD may be formed of the same material by the same (or single) process, and each of the plurality of touch routing lines X-TL and Y-TL, the ground line GND, and the third line GD may be electrically insulated from each other, but is not limited thereto. The plurality of first connection electrodes CE1 and second connection electrodes CE2 may be formed of the same material by the same process. The plurality of first auxiliary lines BRG1 and the second auxiliary lines BRG2 may be formed of the same material by the same process, and each of the plurality of first auxiliary lines BRG1 and the second auxiliary line BRG2 may be electrically insulated from each other, but is not limited thereto.

With reference to FIG. 10, the emission/scan signal driver 310 and various clock signal lines CLK1 and CLK2 may be driven to radiate electromagnetic waves. The radiated electromagnetic wave acts as an electrical noise NS to the plurality of touch routing lines X-TL and Y-TL. For example, among the electromagnetic waves radiated from the emission/scan signal driver 310 and the various clock signal lines CLK1 and CLK2, electromagnetic waves traveling in an upward direction (or the Z-axis direction) may pass through the inorganic insulating layer 140, the planarization layer 150, the bank layer 160, and the encapsulation unit ENCAP and be transmitted to the ground line GND, the second auxiliary line BRG2, the third line GD, the plurality of touch routing lines X-TL and Y-TL and/or the plurality of first auxiliary lines BRG1 to thereby act as electrical noise NS. In FIG. 10, the electrical noise NS is expressed as moving in a dotted line direction, but is not limited to an arrow direction.

The electrical noise NS generated in the plurality of signal lines may be transmitted to the ground line GND, the second auxiliary line BRG2, and the third line GD. Since both the ground line GND and the third line GD are in electrically floating state, the ground line GND and the third line GD may not be affected by the transmitted electrical noise NS.

The electrical noise NS generated in the plurality of signal lines may be transmitted to the plurality of touch routing lines X-TL and Y-TL and the plurality of first auxiliary lines BRG1. Due to the transmitted electrical noise NS, unwanted capacitance is generated in the plurality of touch routing lines X-TL and Y-TL and the plurality of touch electrodes X-TE and Y-TE connected thereto, thereby leading to a decrease in touch performance.

The electrical noise NS generated in the plurality of signal lines may be prevented by the cathode 243. The cathode 243 may simultaneously perform a function of an electrode for driving the light emitting element ED and a function of a low potential voltage source. When the cathode 243 serves as a low potential voltage source, it is possible to absorb and block electrical noise NS generated in the plurality of signal lines. For example, a shielding area SA in which the electrical noise NS to be transmitted to the plurality of touch routing lines X-TL and Y-TL is blocked by the cathode 243 may be formed.

The electrical noise NS generated in the plurality of signal lines may be prevented or at least reduced by the second auxiliary line BRG2. Since the second auxiliary line BRG2 according to the embodiment of the present disclosure extends to an area under a part of the plurality of touch routing lines X-TL and Y-TL, the second auxiliary line BRG2 may absorb and block the electrical noise NS transmitted to the plurality of touch routing lines X-TL and Y-TL. For example, since the second auxiliary line BRG2 extends to the shielding area SA, it may overlap the cathode 243.

The electrical noise NS blocked by the cathode 243 and the extended second auxiliary line BRG2 may not reach a part of the plurality of touch routing lines X-TL and Y-TL. The shielding area SA may be formed over a part or all of the plurality of touch routing lines X-TL and Y-TL. With reference to FIG. 10, although the shielding area SA is illustrated as being parallel to the upward direction (or the Z-axis direction), the electrical noise NS, which is an electromagnetic wave, can radiate in an omni-directional direction, and thus is not limited thereto. For example, the shielding area SA may be widened or narrowed in the upward direction by forming an angle with the Z-axis direction. In the cross-sectional view of FIG. 10, the shielding area SA may have a rectangular shape or a rhombus shape having the cathode 243 as a bottom surface (or a lower surface), but is not limited thereto.

Since the shielding area SA is formed by the cathode 243 and the extended second auxiliary line BRG2 is disposed to overlap therewith, it is possible to prevent a part of the plurality of touch routing lines X-TL and Y-TL from being exposed to the electrically noise NS. Accordingly, a display device robust to electrical noise may be configured. In addition, since a structure for blocking electrical noise is disposed in the non-active area of the display panel without additional components, there is an advantage that a narrow bezel may be implemented, and a degree of freedom in designing a shape of the non-active area may be provided.

A display apparatus according to an embodiment of the present disclosure will be described as follows.

A display apparatus according to an embodiment of the present disclosure comprises a plurality of light emitting elements in an active area and including an anode, a light emitting layer, and a cathode; a plurality of signal lines in a non-active area outside the active area; an encapsulation unit on the plurality of light emitting elements and the plurality of signal lines; a plurality of touch electrodes on the encapsulation unit in the active area; a plurality of first lines on the encapsulation unit in the non-active area and electrically connected to the plurality of touch electrodes; a second line outside the plurality of first lines; a plurality of first auxiliary lines under the plurality of first lines and respectively electrically connected to a part of the plurality of first lines through a plurality of first electrodes; and a second auxiliary line under the second line and electrically connected to the second line through a second electrode. The cathode is disposed on an entire surface of the active area and extends to a shielding area of the non-active area.

According to some embodiments of the present disclosure, the second auxiliary line may extend to an area under the plurality of first lines.

According to some embodiments of the present disclosure, the second auxiliary line may overlap the cathode extending to the shielding area.

According to some embodiments of the present disclosure, a part of the plurality of first auxiliary lines may be disposed in the shielding area.

According to some embodiments of the present disclosure, the display device may further include a third line between the plurality of first lines and the second line and electrically insulated from each of the plurality of first lines and the second line.

According to some embodiments of the present disclosure, the plurality of first lines and the second line may be formed of the same material by the same process.

According to some embodiments of the present disclosure, the plurality of first auxiliary lines and the second auxiliary line may be formed of the same material by the same process.

According to some embodiments of the present disclosure, the plurality of first electrodes and the second electrode may be formed of the same material by the same process.

According to some embodiments of the present disclosure, the plurality of first lines and the second line may be electrically insulated.

According to some embodiments of the present disclosure, the cathode and the second auxiliary line may be configured to block electrical noise that is transmitted from the plurality of signal lines to the plurality of first lines or the plurality of first auxiliary lines.

According to another embodiment of the present disclosure, a display device includes a cathode disposed from an active area to a shielding area of a non-active area; a plurality of signal lines in the non-active area; a plurality of touch routing lines in the shielding area; and a ground line at an outer periphery of the non-active area and connected to a lower line through a second connection electrode. A part of the plurality of touch routing lines are respectively connected to a plurality of bridge lines through a plurality of first connection electrodes. The lower line extends to the shielding area.

According to some embodiments of the present disclosure, the lower line may extend to an area under the plurality of touch routing lines that is not connected to the plurality of bridge lines.

According to some embodiments of the present disclosure, the plurality of touch routing lines and the ground line may be formed of the same material by the same process.

According to some embodiments of the present disclosure, the plurality of touch routing lines and the ground line may be electrically insulated.

According to some embodiments of the present disclosure, the plurality of bridge lines and the lower line may be formed of the same material by the same process.

According to some embodiments of the present disclosure, the cathode and the lower line may be configured to block electrical noise that is transmitted from the plurality of signal lines to the plurality of touch routing lines or the plurality of bridge lines.

According to some embodiments of the present disclosure, the display device may further include a third line between the plurality of touch routing lines and the ground line and electrically insulated from each of the plurality of touch routing lines and the ground line.

It will be apparent to those skilled in the art that various modifications and variations can be made in the present disclosure without departing from the technical idea or scope of the disclosures. Thus, it is intended that the present disclosure covers the modifications and variations of this disclosure provided they come within the scope of the appended claims and their equivalents.

What is claimed is:

1. A display device, comprising:
   a plurality of light emitting elements in an active area, each of the plurality of light emitting elements including an anode, a light emitting layer, and a cathode;

a plurality of signal lines in a non-active area that is outside the active area;
an encapsulation unit on the plurality of light emitting elements and the plurality of signal lines;
a plurality of touch electrodes on the encapsulation unit in the active area;
a plurality of first lines on the encapsulation unit in the non-active area, the plurality of first lines electrically connected to the plurality of touch electrodes;
a second line outside the plurality of first lines;
a plurality of first auxiliary lines under the plurality of first lines and respectively electrically connected to a part of the plurality of first lines through a plurality of first electrodes; and
a second auxiliary line under the second line, the second auxiliary line electrically connected to the second line through a second electrode,
wherein the cathode is on an entire surface of the active area and extends to a shielding area of the non-active area,
wherein the cathode and the second auxiliary line are configured to block electrical noise that is transmitted from the plurality of signal lines to the plurality of first lines or the plurality of first auxiliary lines.

2. The display device of claim 1, wherein the second auxiliary line extends to an area under the plurality of first lines.

3. The display device of claim 2, wherein the second auxiliary line overlaps the cathode extending to a shielding area.

4. The display device of claim 1, wherein a part of the plurality of first auxiliary lines is in a shielding area.

5. A display device comprising:
a plurality of light emitting elements in an active area, each of the plurality of light emitting elements including an anode, a light emitting layer, and a cathode;
a plurality of signal lines in a non-active area that is outside the active area;
an encapsulation unit on the plurality of light emitting elements and the plurality of signal lines;
a plurality of touch electrodes on the encapsulation unit in the active area;
a plurality of first lines on the encapsulation unit in the non-active area, the plurality of first lines electrically connected to the plurality of touch electrodes;
a second line outside the plurality of first lines;
a plurality of first auxiliary lines under the plurality of first lines and respectively electrically connected to a part of the plurality of first lines through a plurality of first electrodes;
a second auxiliary line under the second line, the second auxiliary line electrically connected to the second line through a second electrode; and
a third line between the plurality of first lines and the second line, the third line electrically insulated from each of the plurality of first lines and the second line,
wherein the cathode is on an entire surface of the active area and extends to a shielding area of the non-active area.

6. The display device of claim 1, wherein the plurality of first lines and the second line include a same material and are formed by a same process.

7. The display device of claim 1, wherein the plurality of first auxiliary lines and the second auxiliary line include a same material and are formed by a same process.

8. The display device of claim 1, wherein the plurality of first electrodes and the second electrode include a same material and are formed by a same process.

9. The display device of claim 1, wherein the plurality of first lines and the second line are electrically insulated from each other.

10. A display device, comprising:
a cathode disposed from an active area to a shielding area of a non-active area;
a plurality of signal lines in the non-active area;
a plurality of touch routing lines in the shielding area; and
a ground line at an outer periphery of the non-active area, the ground line connected to a lower line through a second connection electrode,
wherein a part of the plurality of touch routing lines are respectively connected to a plurality of bridge lines through a plurality of first connection electrodes,
wherein the lower line extends to the shielding area,
wherein the cathode and the lower line are configured to block electrical noise that is transmitted from the plurality of signal lines to the plurality of touch routing lines or the plurality of bridge lines.

11. The display device of claim 10, wherein the lower line extends to an area under the plurality of touch routing lines that is not connected to the plurality of bridge lines.

12. The display device of claim 10, wherein the plurality of touch routing lines and the ground line include a same material and are formed by the same process.

13. The display device of claim 12, wherein the plurality of touch routing lines and the ground line are electrically insulated from each other.

14. The display device of claim 10, wherein the plurality of bridge lines and the lower line include a same material and are formed by a same process.

15. A display device comprising:
a cathode disposed from an active area to a shielding area of a non-active area;
a plurality of signal lines in the non-active area;
a plurality of touch routing lines in the shielding area;
a ground line at an outer periphery of the non-active area, the ground line connected to a lower line through a second connection electrode; and
a third line between the plurality of touch routing lines and the ground line, the third line electrically insulated from each of the plurality of touch routing lines and the ground line,
wherein a part of the plurality of touch routing lines are respectively connected to a plurality of bridge lines through a plurality of first connection electrodes,
wherein the lower line extends to the shielding area.

* * * * *